April 3, 1951 R. ADLER 2,547,145

SPACE-CHARGE-COUPLED CASCADE AMPLIFIER

Filed Dec. 27, 1948

ROBERT ADLER
*INVENTOR.*

BY [signature]

HIS AGENT

Patented Apr. 3, 1951

2,547,145

UNITED STATES PATENT OFFICE 2,547,145

SPACE-CHARGE-COUPLED CASCADE AMPLIFIER

Robert Adler, Chicago, Ill., assignor to Zenith Radio Corporation, a corporation of Illinois Application December 27, 1948, Serial No. 67,331

15 Claims. (Cl. 179—171)

Figure 1:
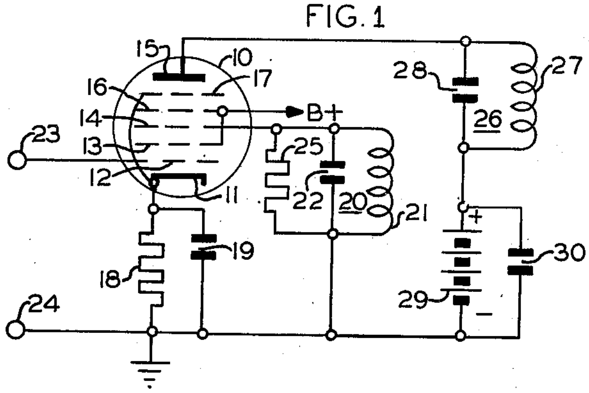

This invention relates to signal amplifiers, and more particularly to such amplifiers of the type incorporating an electron discharge device. It is a primary object of the invention to provide an improved and simplified signal amplifier which utilizes the space charge coupling effect to achieve considerably greater overall gain with a single electron discharge device than is obtained with conventional radio frequency amplifiers.

Another important object of the present invention is to provide an improved radio frequency signal amplifier which embodies two or more stages of amplification cascaded along a single electron stream.

Yet another object of the invention is to provide an improved wide band signal amplifier which utilizes the space charge coupling effect to afford considerably greater gain than that provided by wide band amplifiers now in customary use.

In accordance with the present invention, two stages of voltage amplification are cascaded along a single electron stream. The first or input grid of an electron discharge device, such as a conventional pentagrid converter tube, is supplied with radio frequency input signals, and a positive unidirectional operating potential is applied to the screen grid to set up a virtual cathode in the vicinity of a following grid, hereinafter termed the control grid (the third grid customarily employed as the signal grid in converter applications). A two-terminal load circuit has one terminal coupled externally of the device to control grid only and the other terminal returned to the cathode, and has an impedance at the input signal frequency at least as great as the reciprocal of the effective transconductance (to be defined hereinafter) at the signal frequency of the input grid with respect to the control grid. An output circuit, responsive to the frequency of the input signals, is coupled between the output electrode or anode and the cathode. With this arrangement, signal amplification occurs first between the input grid and the control grid, and further amplification takes place between the control grid and the output electrode.

Figure 3:
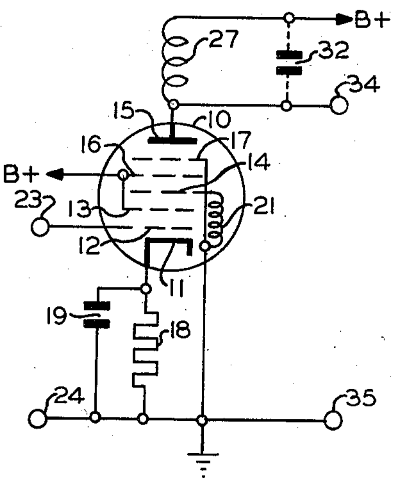
Figure 2:
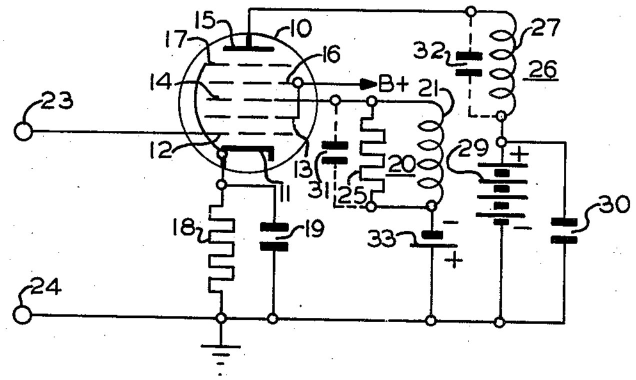
Figure 4:
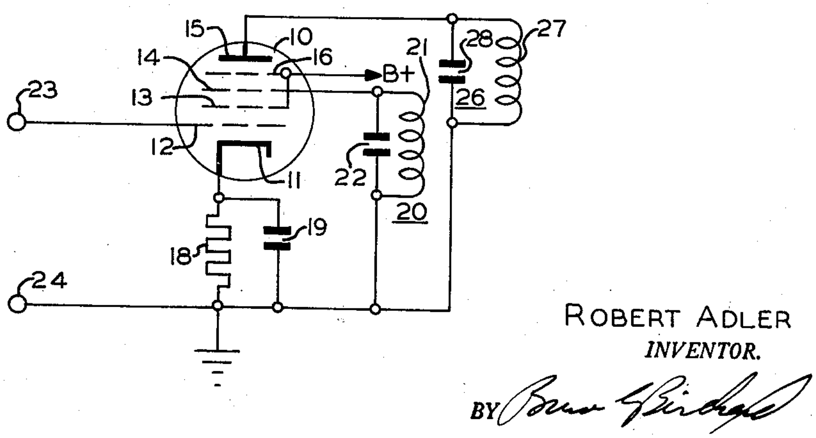

The features of the invention which are believed to be novel are set forth with particularity in the appended claims. The invention, together with further objects and advantages thereof, may more readily be understood, however, by reference to the following description taken in connection with the accompanying drawing, in the several figures of which like reference numerals indicate like elements, and in which:

Figure 1 is a schematic diagram of a signal amplifier embodying the present invention, Figure 2 is a schematic circuit diagram of an embodiment of the invention particularly suited to amplification over a wide band of signal frequencies, Figure 3 is a schematic diagram of a modification of the circuit of Figure 2, and Figure 4 is a schematic circuit diagram of a further modification of the invention.

With reference to Figure 1, there is shown in schematic form a signal amplifier embodying an electron discharge device 10 including in the order named a cathode 11, an input grid 12, a screen electrode 13, a control grid 14, and an output electrode 15 disposed along a single electron path; a second screen electrode 16 and a suppressor grid 17 may be included between control grid 14 and output electrode 15. While screen electrode 13 has been represented as constructed as a grid, it is apparent that a slotted construction may be employed with equal advantage. Cathode 11 is connected to ground through a passive biasing network comprising a cathode bias resistor and an associated bypass condenser 19.

A two-terminal load circuit 20, comprising the parallel combination of an inductor 21 and a condenser 22, is coupled between control grid 14 and cathode 11, one terminal of load circuit 20 being coupled externally of the device to control grid 14 only. Load circuit 20 is tunable, as for example by means of an iron core associated with inductor 21, to the frequency of input signals applied between input grid 12 and cathode 11 by means of an input circuit comprising input terminals 23 and 24. A damping resistance 25 may be included in load circuit 20 to suppress undesirable regeneration. Control grid 14 is maintained at a potential near the direct potential of the cathode 11 by connecting load circuit 20 directly between control grid 14 and cathode bias resistor 18.

In practice, the unidirectional bias potential of the control grid 14 may be set at any value within a practical range of positive and negative voltages which are very small in magnitude with respect to B+. For an electron discharge device 10 of the type 6BE6, the practical range of control grid bias potentials may include positive and negative potentials of magnitude less than 10% of the B+ potential. It is intended, in the appended claims, that the phrase "approximately at the direct potential of the cathode" shall include this practical range of small bias potentials.

An output circuit 26, which may comprise the parallel combination of an inductor 27 and a condenser 28, is coupled between the output electrode 15 and cathode 11 through a suitable source of positive unidirectional operating potential, such source being here shown as a battery 29 bypassed for radio frequency signals by a condenser 30.

It is known in the art that when a stream of electrons is accelerated under the influence of a high potential screen electrode and is thereafter retarded by a following grid of approximately zero potential, a space charge cloud or virtual cathode is established in the vicinity of the low potential grid. All of the emitted electrons terminate at the high potential screen electrode or at the anode, and substantially none strike the low potential grid.

If now, the stream of electrons is varied before passing through the screen, as by a signal impressed on the input grid, the charge density of the virtual cathode is caused to vary in a corresponding manner, and a signal frequency potential variation is established at the low potential grid by electrostatic induction; consequently, a corresponding current is capacitively induced in the circuit coupled between the low potential grid and the cathode.

This effect, hereinafter termed the space charge coupling effect, has been formally likened to a unilateral negative capacity, from the input grid to the low potential grid, which has a magnitude in the order of several micro-micro-farads. As a first approximation, the term "effective transconductance" is employed to signify the susceptance at the input signal frequency of the equivalent space charge coupling capacity from one electrode to another, for example from the input grid to the low potential control grid. If the input signal frequency is designated $f$, and the equivalent space charge coupling capacity is denoted by the letter C, the effective transconductance at the input signal frequency of the input grid with respect to the control grid is approximately $2\pi f C$.

The effective transconductance is thus proportional to the signal frequency and attains the order of magnitude of the static transconductance (as commonly defined) of the input grid at frequencies of about 100 to 200 megacycles per second. Transit time effects prevent any further increase of effective transconductance at higher frequencies. Furthermore, transit time effects introduce a certain unavoidable amount of phase delay. The effective transconductance is, however, of very useful magnitude in the frequency ranges presently used for frequency modulation and television broadcasting.

The effective transconductance may be accurately measured by applying an input signal to the first grid 12 and observing the signal frequency current induced in the circuit coupled to the low potential or control grid 14. The effective transconductance at the particular signal frequency used is then defined, as used in the following description and in the appended claims, as the amount of signal frequency current in the circuit coupled to the control grid per unit signal frequency input voltage.

In operation, application of suitable positive operating potential, schematically designated as B+, to the screen electrode 13, operates to establish a virtual cathode in the vicinity of control grid 14. Application of a radio frequency input signal between terminals 23 and 24 effects a variation in the charge density of the virtual cathode and electrostatically induces a current of corresponding frequency in the load circuit 20. If the parameters of load circuit 20 are so chosen that the impedance of such circuit at the frequency of the input signals is at least equal to the reciprocal of the effective transconductance of the input grid 12 with respect to the control grid 14 at that frequency, voltage amplification occurs between input grid 12 and control grid 14. In practice, it is preferred that the impedance of load circuit 20 at the input signal frequency be substantially greater than the reciprocal of such effective transconductance, and ratios of impedance to effective transconductance as large as 100 may be advantageously employed.

Since control element 14 is a grid, potential variations in the load circuit 20 impress a new and amplified signal on the electron stream between the cathode 11 and the output electrode 15. This new and amplified signal operates to control the electron stream and further amplification occurs between the control grid 14 and output electrode 15 in a conventional manner. Thus a further amplified signal, corresponding in frequency to the input signal, is developed in load circuit 26 and may be utilized in any suitable manner, as for example by supplying the output signal to the input grid of the first detector of a conventional radio receiver (not shown).

With an arrangement such as that shown in Figure 1, in which two stages of amplification are cascaded along a single electron stream, overall amplification from input circuit to output circuit may be as high as 500. In order to suppress undesirable regeneration, caused by unavoidable residual coupling between tuned circuits, a damping resistance 25 may be included in the load circuit 20 coupled between the control grid 14 and the cathode; the use of such a damping resistance results in a decrease in overall gain, but the obtainable gain with regeneration reduced to a practical degree still may be in the vicinity of 200 to 300 times.

Merely by way of illustration, and in no sense by way of limitation, the following circuit parameters may be utilized in the circuit of Figure 1 to obtain an overall amplification, across a frequency band having a width of 1 megacycle per second (measured between the half-power points) and having a center frequency of 100 megacycles per second, of about 100 times.

| | |
|---|---|
| Electron discharge device 10 | Type 6BA7 |
| Condenser 22 (including tube capacity) | 14 $\mu\mu f$ |
| Resistor 25 | 1600 ohms |
| Inductor 21 | 0.17 $\mu H$ |
| Inductor 27 | 0.17 $\mu H$ |
| Condenser 28 (including tube capacity) | 14 $\mu\mu f$ |
| Resistor 18 | 20 ohms |
| Condenser 19 | 1000 $\mu\mu f$ |
| B+ | 105 volts |
| Battery 29 | 250 volts |

While the circuit of Figure 1 embodies two stages of amplification cascaded along a single electron stream, it is to be understood that three or more stages of amplification may be employed. For example, two systems, each incorporating a screen electrode followed by a control grid to which is coupled a suitable load circuit, may be included between the cathode and the output electrode. In this event, amplified signals appear in the two load circuits by virtue of the space charge coupling effect, and a further amplification occurs between the control grid of the second system and the output electrode in the conventional manner.

Figure 2 is a schematic representation of a modification of the invention particularly adaptable to amplification over a wide band of signal frequencies. The circuit of Figure 2 is very similar to that of Figure 1; however, no external capacity elements are employed. The capacity 31 for the load circuit 20 and the capacity 32 for the output circuit 26 are furnished by the interelectrode capacities of electron discharge device 10 and other stray circuit capacities. Inductor 21 may be highly damped in order to suppress undesired regeneration. Control grid 14 is maintained at a slightly negative potential with respect to the cathode 11 by means of a small battery 33. In practice, the unidirectional operating potential of the control grid 14 may be set at any value within the range between its negative cut-off potential and several volts positive; in no case does its magnitude exceed a small fraction (about 10%) of the screen electrode operating potential B+.

The operation of the circuit of Figure 2 is substantially identical with that of the circuit of Figure 1; however, since capacities 31 and 32 are entirely constituted by the interelectrode capacities of the tube 10, circuits 20 and 26 may be designed to be responsive to frequencies throughout a wide band. With the arrangement of Figure 2, an overall voltage gain from the input grid 12 to the output electrode 15 of about 14 times has been obtained across a band of 6 megacycles with a center frequency of 100 megacycles. Such an arrangement is particularly useful as a radio frequency amplifier in a television receiver.

The embodiment of Figure 3 is a modification of the circuit shown in schematic form in Figure 2 in which the inductor 21 of the control grid load circuit 20 is a highly damped self-resonant coil included within the evacuated envelope of the electron discharge device 10. Amplified output voltage appears between output terminals 34 and 35 connected across output impedance 27.

The embodiment of Figure 4 is a modification of the circuit of Figure 1 in which not only the amplification from the input grid 12 to the control grid 14, but also the amplification from control grid 14 to output electrode 15, is accomplished by virtue of the space charge coupling effect. The unidirectional operating potential of output electrode 15 is maintained near that of the cathode 11 by connecting the output circuit 26 directly between output electrode 15 and cathode bias resistor 18. If the impedance of load circuit 20 at the signal frequency is made at least equal to, and preferably substantially greater than, the reciprocal of the effective transconductance at signal frequency of the input grid 12 with respect to the control grid 14, voltage gain takes place between input grid 12 and control grid 14. If the impedance of the output circuit 26 is made at least equal to, and preferably substantially greater than, the reciprocal of the effective transconductance at signal frequency of the control grid 14 with respect to the output electrode 15, further voltage amplification occurs between control grid 14 and output electrode 15. By thus cascading two stages of space charge amplification along a single electron stream, overall voltage gains of several hundred times may be obtained.

While the invention has been shown and described in connection with certain and specific embodiments thereof, it is to be understood that numerous variations and modifications may be made. It is therefore contemplated in the appended claims to cover all such variations and modifications as fall within the true spirit and scope of the invention.

I claim:

1. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit having one terminal coupled externally of said device to said control grid only and having the other terminal returned to said cathode, and having an impedance at the frequency of said input signals at least equal to the reciprocal of the effective transconductance, at said input-signal frequency, of said input grid with respect to said control grid for developing an amplified signal at said input-signal frequency by space charge coupling from said input grid and for impressing said amplified signal on said control grid; and an output load circuit coupled between said output electrode and said cathode and responsive to said input-signal frequency.

2. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit having an impedance at the frequency of said input signals at least equal to the reciprocal of the effective transconductance, at said input-signal frequency, of said input grid with respect to said control grid; means for coupling one terminal of said load circuit externally of said device to said control grid only and for returning the other terminal of said load circuit to said cathode, and for maintaining said control grid at approximately the direct potential of said cathode; and an output load circuit coupled between said output electrode and said cathode and responsive to said input-signal frequency.

3. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit having an impedance at the frequency of said input signals at least equal to the reciprocal of the effective transconductance, at said input-signal frequency, of said input grid with respect to said control grid; means for coupling one terminal of said load circuit externally of said device to said control grid only and for returning the other terminal of said load circuit to said cathode, and for maintaining said control grid at a direct potential having a magnitude small with respect to said screen electrode operating potential; and an output load circuit coupled between said output electrode and said cathode and responsive to said input-signal frequency.

4. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit having an impedance at the frequency of said input signals at least equal to the reciprocal of the effective transconductance, at said input-signal frequency, of said input grid with respect to said control grid; means for coupling one terminal of said load circuit externally of said device to said control grid only and for returning the other terminal of said load circuit to said cathode, and for maintaining said control grid at a direct potential having a magnitude not exceeding 10% of said screen electrode operating potential; and an output load circuit coupled between said output electrode and said cathode and responsive to said input-signal frequency.

5. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit having an impedance at the frequency of said input signals at least equal to the reciprocal of the effective transconductance, at said input-signal frequency, of said input grid with respect to said control grid; means for coupling one terminal of said load circuit externally of said device to said control grid only and for returning the other terminal of said load circuit to said cathode, and for maintaining said control grid at a direct potential having a magnitude not exceeding 10% of said screen electrode operating potential; and an output load circuit maintained at a high positive unidirectional operating potential coupled between said output electrode and said cathode and responsive to said input-signal frequency.

6. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit, including an inductor, having one terminal coupled externally of said device to said control grid only and having the other terminal returned to said cathode, and having an impedance at the frequency of said input signals substantially greater than the reciprocal of the effective transconductance, at said input-signal frequency, of said input grid with respect to said control grid for developing an amplified signal at said input-signal frequency by space charge coupling from said input grid and for impressing said amplified signal on said control grid; and an output circuit coupled between said output electrode and said cathode and responsive to said input-signal frequency.

7. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit having one terminal coupled externally of said device to said control grid only and having the other terminal returned to said cathode, tunable to the frequency of said input signals, and having an impedance at the frequency of said input signals substantially greater than the reciprocal of the effective transconductance, at said input-signal frequency, of said input grid with respect to said control grid for developing an amplified signal at said input-signal frequency by space charge coupling from said input grid and for impressing said amplified signal on said control grid; and an output circuit coupled between said output electrode and said cathode and responsive to said input-signal frequency.

8. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit having one terminal coupled externally of said device to said control grid only and having the other terminal returned to said cathode, and comprising an inductor shunted by capacity and tunable to the frequency of said input signals; and an output load circuit coupled between said output electrode and said cathode and responsive to said input-signal frequency.

9. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit comprising an inductor shunted by capacitance and tunable to the frequency of said input signals; means for coupling one terminal of said load circuit externally of said device to said control grid only and for returning the other terminal of said load circuit to said cathode, and for maintaining said control grid at approximately the direct potential of said cathode; and an output circuit coupled between said output electrode and said cathode and tunable to said input-signal frequency.

10. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit comprising an inductor shunted by capacitance and tunable to the frequency of said input signals; means for coupling one terminal of said load circuit externally of said device to said control grid only and for returning the other terminal of said load circuit to said cathode, and for maintaining said control grid at a direct potential having a magnitude small with respect to said screen electrode operating potential; and an output circuit coupled between said output electrode and said cathode and tunable to said input-signal frequency.

11. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit comprising an inductor shunted by capacitance and tunable to the frequency of said input signals; means for coupling one terminal of said load circuit externally of said device to said control grid only and for returning the other terminal of said load circuit to said cathode, and for maintaining said control grid at a direct potential having a magnitude not exceeding 10% of said screen electrode operating potential; and an output circuit coupled between said output electrode and said cathode and tunable to said input-signal frequency.

12. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit comprising an inductor shunted by capacitance and tunable to the frequency of said input signals; means for coupling one terminal of said load circuit externally of said device to said control grid only and for returning the other terminal of said load circuit to said cathode, and for maintaining said control grid at a direct potential having a magnitude not exceeding 10% of said screen electrode operating potential; and an output circuit maintained at a high positive unidirectional operating potential coupled between said output electrode and said cathode and tunable to said input-signal frequency.

13. A cascade amplifier comprising: an electron discharge device including in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit having an impedance at the frequency of said input signals at least equal to the reciprocal of the effective transconductance, at said input-signal frequency, of said input grid with respect to said control grid; means for coupling one terminal of said load circuit externally of said device to said control grid only and for returning the other terminal of said load circuit to said cathode, and for maintaining said control grid at approximately the direct potential of said cathode; an output circuit having an impedance at said input-signal frequency substantially greater than the reciprocal of the effective transconductance at said input-signal frequency of said control grid with respect to said anode; and means for coupling said output circuit to said output electrode and said cathode and for maintaining said output electrode at approximately the direct potential of said cathode.

14. A cascade amplifier comprising: an electron discharge device including within an evacuated envelope in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid; an input circuit for the application of radio frequency input signals between said input grid and said cathode; a two-terminal load circuit having one terminal coupled externally of said device to said control grid only and having the other terminal returned to said cathode, and comprising an inductor included within said envelope, said load circuit having an impedance at the frequency of said input signals at least equal to the reciprocal of the effective transconductance, at said input-signal frequency, of said input grid with respect to said control grid for developing an amplified signal at said input-signal frequency by space charge coupling from said input grid and for impressing said amplified signal on said control grid; and an output circuit coupled between said output electrode and said cathode and responsive to said input-signal frequency.

15. A cascade amplifier comprising: an electron discharge device including within a evacuated envelope in the order named a cathode, an input grid, a screen electrode, a control grid, and an output electrode disposed across a single electron path; means for applying a positive unidirectional operating potential to said screen electrode to establish a virtual cathode intermediate said screen electrode and said control grid;

an input circuit for the application of radio frequency input signals between said input grid and said cathode; a two-terminal load circuit having one terminal coupled externally of said device to said control grid only and having the other terminal returned to said cathode, and comprising an inductor included within said envelope, said load circuit having an impedance at the frequency of said input signals at least equal to the reciprocal of the effective transconductance, at said input-signal frequency, of said input grid with respect to said control grid for developing an amplified signal at said input-signal frequency by space charge coupling from said input grid and for impressing said amplified signal on said control grid; and an output circuit coupled between said output electrode and said cathode comprising an additional inductor and responsive to said input-signal frequency.

ROBERT ADLER.

REFERENCES CITED

The following references are of record in the file of this patent:

UNITED STATES PATENTS

| Number | Name | Date |
|---|---|---|
| 2,235,817 | Freeman | Mar. 25, 1941 |
| 2,426,680 | Gustafson | Sept. 2, 1947 |